(12) United States Patent
Ota et al.

(10) Patent No.: US 10,761,142 B2
(45) Date of Patent: Sep. 1, 2020

(54) BATTERY MONITORING UNIT

(71) Applicant: YAZAKI CORPORATION, Tokyo (JP)

(72) Inventors: Takao Ota, Shizuoka (JP); Kazuya Harakawa, Shizuoka (JP); Yoshiaki Ichikawa, Shizuoka (JP); Yoshiaki Nakayama, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/714,578

(22) Filed: Sep. 25, 2017

(65) Prior Publication Data

US 2018/0088179 A1 Mar. 29, 2018

(30) Foreign Application Priority Data

Sep. 26, 2016 (JP) .................. 2016-187522

(51) Int. Cl.
*G01R 31/36* (2020.01)
*H01R 25/16* (2006.01)
(Continued)

(52) U.S. Cl.
CPC ......... *G01R 31/396* (2019.01); *H01R 12/592* (2013.01); *H01R 13/405* (2013.01); *H01R 25/164* (2013.01); *H05K 1/118* (2013.01); *H01R 11/288* (2013.01); *H01R 2201/20* (2013.01); *H05K 3/4015* (2013.01); *H05K 2201/053* (2013.01); *H05K 2201/09063* (2013.01); *H05K 2201/10037* (2013.01); *H05K 2201/10272* (2013.01)

(58) Field of Classification Search
CPC ... G01R 31/3658; H01R 12/592; H05K 1/118
See application file for complete search history.

(56) References Cited

U.S. PATENT DOCUMENTS

| 2011/0104556 A1 | 5/2011 | Kim et al. |
| 2012/0019061 A1 | 1/2012 | Nishihara et al. |
| (Continued) | | |

FOREIGN PATENT DOCUMENTS

| JP | 2013-105571 A | 5/2013 |
| JP | 2014-103031 A | 6/2014 |
| (Continued) | | |

OTHER PUBLICATIONS

Japanese Office Action for the related Japanese Patent Application No. 2016-187522 dated Oct. 2, 2018.

*Primary Examiner* — Minh Q Phan
(74) *Attorney, Agent, or Firm* — Kenealy Vaidya LLP

(57) ABSTRACT

A battery monitoring unit includes a plurality of voltage detection lines, a flexible printed circuit board extending in a stuck direction of single batteries, an electronic circuit connected to one end portions of the plurality of the voltage detection lines so as to detect voltage of each of the single batteries and mounted on the flexible printed circuit board, a plurality of busbar fixing portions formed integrally with the flexible printed circuit board and to which the plurality of the busbars are fixed respectively, and communication lines disposed in the flexible printed circuit board so as to connect between the electronic circuit and a battery ECU.

6 Claims, 8 Drawing Sheets

(51) Int. Cl.
*G01R 31/396* (2019.01)
*H01R 12/59* (2011.01)
*H01R 13/405* (2006.01)
*H05K 1/11* (2006.01)
*H01R 11/28* (2006.01)
*H05K 3/40* (2006.01)

(56) References Cited

U.S. PATENT DOCUMENTS

2014/0017533 A1    1/2014   Nishihara et al.
2014/0335378 A1*   11/2014   Kuroda ................ H01M 2/206
                                                          429/7

FOREIGN PATENT DOCUMENTS

| JP | 2014-220157 A | 11/2014 |
| JP | 2015-22965 A | 2/2015 |
| JP | 2015-49931 A | 3/2015 |
| JP | 2016-139616 A | 8/2016 |
| WO | 2010/113455 A1 | 10/2010 |

* cited by examiner

BATTERY MONITORING UNIT

CROSS REFERENCE TO RELATED APPLICATIONS

This application claims priority from Japanese Patent Application No. 2016-187522 filed on Sep. 26, 2016, the entire contents of which are incorporated herein by reference.

BACKGROUND OF THE INVENTION

Field of the Invention

The present invention relates to a battery monitoring unit.

Description of Related Art

A power storage device which is a battery assembly is constituted by a plurality of single batteries (battery cells) which are connected to one another side by side. In a power storage device 501 shown in FIG. 8A, electrode terminals 507 of adjacent battery cells 505 are connected by busbars 503, and the busbars 503 are coupled by voltage detection lines 509 such as FFCs (Flexible Flat Cables). The voltage detection lines 509 are respectively led out of opposite sides of the electrode terminals 507 of the battery cells 505 arranged in parallel, and connected to a battery ECU 511 having a battery cell voltage detection circuit (electronic circuit) provided in another box. For this reason, the voltage detection lines 509 require long wirings.

As a solution to this problem, it has been proposed that a voltage detection circuit of a battery monitoring unit is housed in a battery pack as in Patent Literatures 1 and 2. For example, a battery pack disclosed in Patent Literature 1 includes a circuit board, a circuit board fixation member, busbar retention members, and a wiring portion. The circuit board detects voltage of each of battery cells. The circuit board fixation member has a board housing portion to which the circuit board is attached. The circuit board fixation member extends in a stuck direction of the battery cells. The busbar retention members are formed integrally with the circuit board fixation member so as to house busbars disposed side by side in the stuck direction so as to connect electrode terminals of the battery cells. The wiring portion is placed on the circuit board fixation member. The wiring portion includes the plurality of busbars, and a flexible wiring portion or a wiring central portion which is connected between the busbars and the circuit board.

According to such a battery pack, the circuit board having the voltage detection circuit can be housed in the battery pack.

[Patent Literature 1] JP-A-2015-22965
[Patent Literature 2] JP-A-2015-49931

According to a related art, in a battery monitoring unit, a circuit board, a wiring portion and busbars have to be disposed respectively and fixed integrally on the circuit board fixation member in which the board housing portion housing the circuit board and the busbar retention members housing the busbars are formed integrally. Therefore, assembling work for the battery monitoring unit becomes so complex that there is a problem that manufacturing cost may increase.

SUMMARY

One or more embodiments provide a battery monitoring unit which is in a simple structure so that complex assembling work can be reduced.

In an aspect (1), a battery monitoring unit includes a plurality of voltage detection lines, a flexible printed circuit board extending in a stuck direction of single batteries, an electronic circuit connected to one end portions of the plurality of the voltage detection lines so as to detect voltage of each of the single batteries and mounted on the flexible printed circuit board, a plurality of busbar fixing portions formed integrally with the flexible printed circuit board and to which the plurality of the busbars are fixed respectively, and communication lines disposed in the flexible printed circuit board so as to connect between the electronic circuit and a battery ECU. The other end portions of the plurality of the voltage detection lines are respectively connected to the plurality of the busbars disposed in the stuck direction so as to electrically connect the plurality of the single batteries of a battery assembly. The plurality of the voltage detection lines are disposed in the flexible printed circuit board.

According to the aspect (1), the voltage detection lines, the busbar fixing portions and the communication lines are formed integrally as the flexible printed circuit board. The voltage detection lines are connected to the busbars by which the single batteries are electrically connected to one another. The busbars are fixed to the busbar fixing portions. The communication lines are provided for making connection between the electronic circuit and the battery ECU. The electronic circuit for detecting voltage of each of the single batteries is directly mounted on the flexible printed circuit board. In this manner, the battery monitoring unit is configured. Therefore, the battery monitoring unit has the aforementioned configuration in which constituent components of the electronic circuit such as a chip fuse and cell monitoring ICs can be surface-mounted on the flexible printed circuit board so as to be formed integrally therewith. In the flexible printed circuit board, the voltage detection lines and the communication lines are, for example, formed as a circuit on a base film by printing. Thus, assembling work for the battery monitoring unit can be easier than that for the background-art battery monitoring unit.

In an aspect (2), the plurality of the busbar fixing portions include flexible bridge portions between adjacent ones of a plurality of opening portions opening at predetermined interval in a row in the stuck direction. Each of the plurality of the opening portions has an opening width wider than a transverse-direction width of each of the plurality of the busbars, in a direction which is perpendicular to the stuck direction and a thickness direction of each of the plurality of the busbars.

According to the aspect (2), the flexible bridge portions of the busbar fixing portions to which the busbars are fixed have flexibility. Therefore, when the battery monitoring unit is attached to the power storage device, the flexible bridge portions can be slanted or bent so that the busbars can be displaced following electrodes of the single batteries. Accordingly, individual differences of the cells and pitch tolerances or height differences of the electrodes caused by expansion etc. among the single batteries can be also absorbed.

In an aspect (3), the plurality of the busbars are soldered and fixed to lands positioned and extending on the flexible bridge portions from the other end portions of the plurality of the voltage detection lines respectively.

According to the aspect (3), the busbars can be soldered to the lands of the flexible bridge portions simultaneously when the constituent components of the electronic circuit are surface-mounted on the flexible printed circuit board. Therefore, electric connection of the busbars to the voltage detection lines and fixation of the busbars to the flexible bridge portions can be performed simultaneously. Thus, assembling work for the battery monitoring unit can be further easier.

In an aspect (4), a gas discharging duct extending in the stuck direction so as to discharge gas generated inside the single batteries to the outside is disposed on upper surfaces of the single batteries. A portion of the flexible printed circuit board, on which the electronic circuit is mounted, is disposed to be contact with an upper surface of the gas discharging duct.

According to the aspect (4), gas generated inside the single batteries can be discharged to the outside by the gas discharging duct. In addition, the portion of the flexible printed circuit board where the electronic circuit is mounted is disposed to make contact with the upper surface of the gas discharging duct. Accordingly, the electronic circuit mounted on the flexible printed circuit board can be supported surely.

Advantageous Effects of Invention

According to the battery monitoring unit according to the invention, it is possible to reduce complex assembling work using a simple structure.

The invention has been described above briefly. Further, when modes (hereinafter referred to as "embodiments") for carrying out the invention which will be described below are read through with reference to the accompanying drawings, details of the invention can be made clearer.

DETAILED DESCRIPTION

Exemplary embodiments are described below with reference to the drawings.

Figure 1:
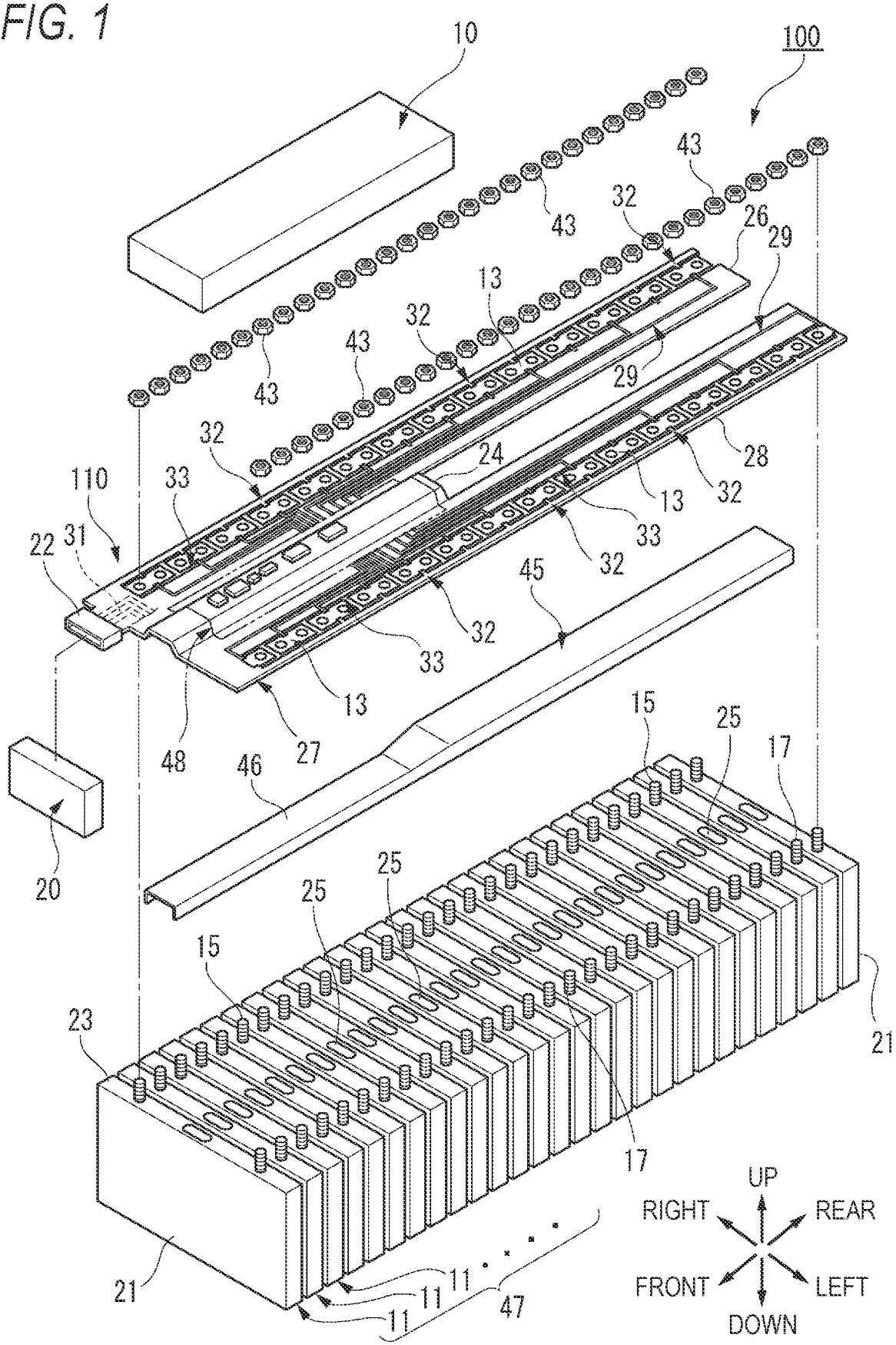
FIG. 1 is an exploded perspective view schematically showing the configuration of a power storage device provided with a battery monitoring unit according to a first embodiment.
Figure 2:
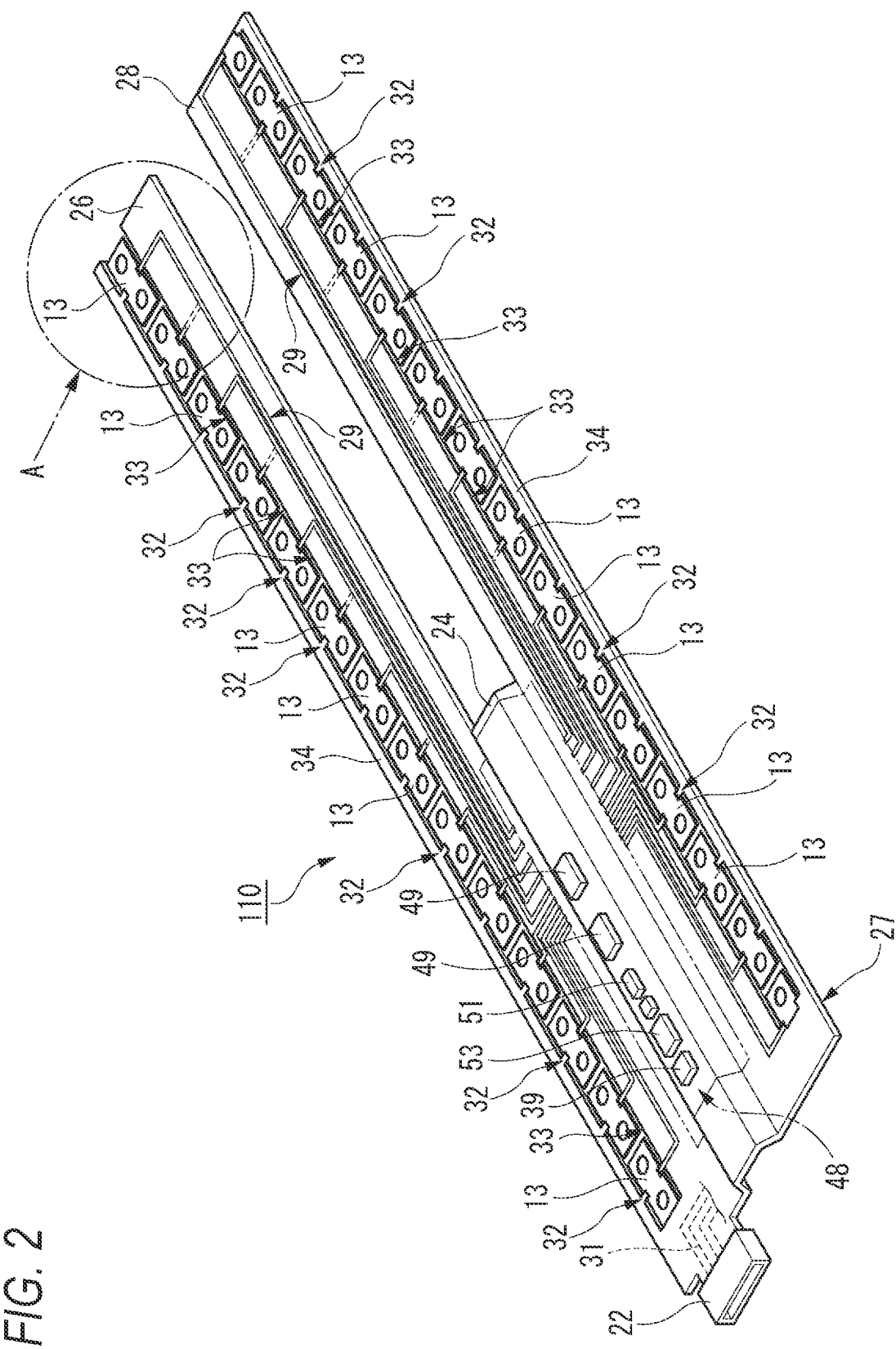
FIG. 2 is an overall perspective view of the battery monitoring unit shown in FIG. 1.
Figure 3A:
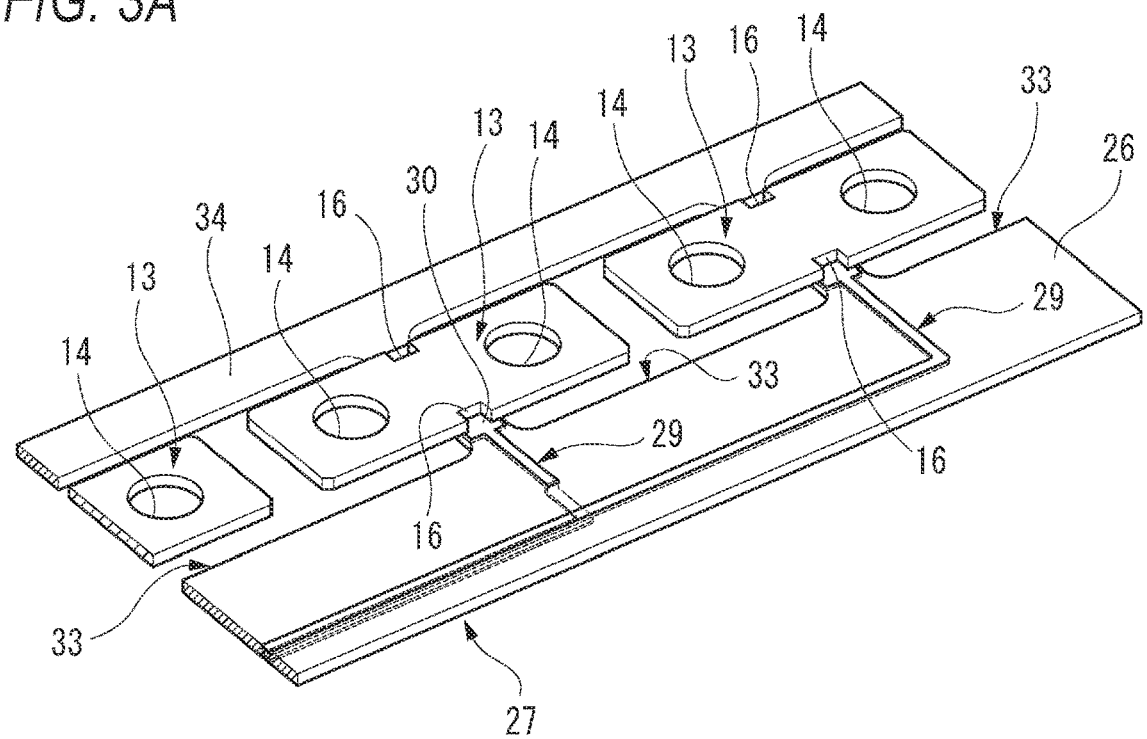
FIG. 3A is perspective view of an enlarged portion A of the battery monitoring unit in FIG. 2.
Figure 3B:
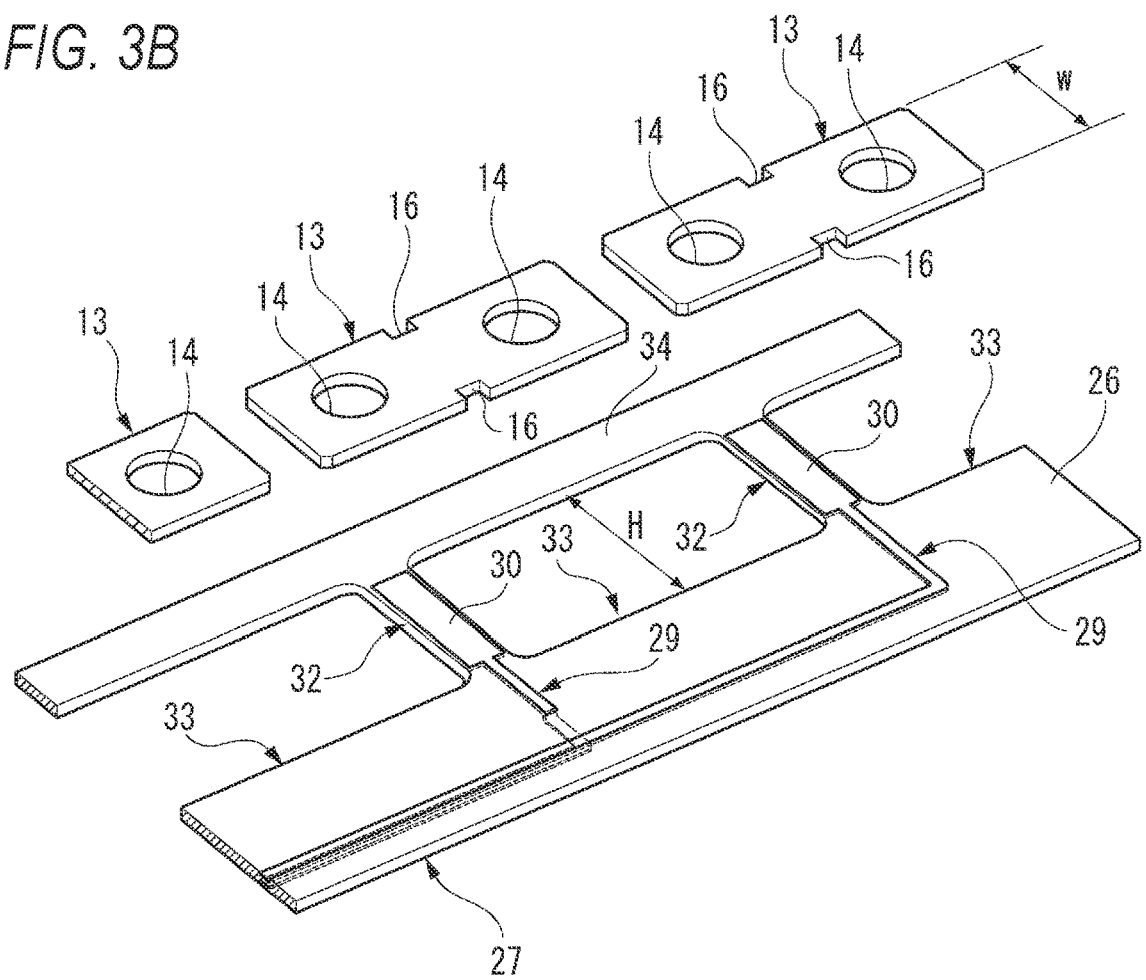
FIG. 3B is an exploded perspective view of busbars in FIG. 3A.

FIG. 1 is an exploded perspective view schematically showing the configuration of a power storage device 100 provided with a battery monitoring unit 110 according to a first embodiment of the invention. FIG. 2 is a perspective view of the battery monitoring unit 110 shown in FIG. 1. FIG. 3A is a perspective view of an enlarged portion A of the battery monitoring unit 110 in FIG. 2. FIG. 3B is an exploded perspective view of busbars 13 in FIG. 3A. Incidentally, in the embodiment, up/down, front/rear and left/right directions will follow directions of arrows shown in FIG. 1.

The power storage device 100 provided with the battery monitoring unit 110 according to the first embodiment can be mounted in a vehicle and used as a power source for driving the vehicle. That is, electric energy outputted from the power storage device 100 can be converted into kinetic energy by a motor generator to drive the vehicle. In addition, when kinetic energy generated during braking of the vehicle is converted into electric energy by the motor generator, the power storage device 100 can store the electric energy as regenerative electric power.

As shown in FIG. 1, the power storage device 100 is a battery assembly 47 having a plurality of single batteries 11 which are stucked and disposed in the front/rear direction. For example, the plurality of single batteries 11 are housed in a box-shaped case or bound with a binding band to be fixed integrally. A rechargeable battery such as a nickel-metal hydride battery or a lithium-ion battery can be used as each of the single batteries 11. Here, the plurality of single batteries 11 are electrically connected in series. That is, the busbars 13 are disposed on upper surfaces of the single batteries 11. Two single batteries 11 which are adjacent to each other in the front/rear direction are electrically connected in series by each of the busbars 13.

Each of the single batteries 11 is provided with a rectangular parallelepiped battery body 21, and a pair of a positive electrode terminal 15 and a negative electrode terminal 17. The positive electrode terminal 15 and the negative electrode terminal 17 are electrodes protruding respectively from one end and the other end of an upper surface 23 of the battery body 21. The positive electrode terminal 15 is electrically connected to a positive electrode plate (current collector plate) of a power generation element inside the battery body 21. The negative electrode terminal 17 is electrically connected to a negative electrode plate (current collector plate) of the power generation element inside the battery body 21. In addition, a valve 25 is provided in the upper surface 23 of the battery body 21. The valve 25 is provided between the positive electrode terminal 15 and the negative electrode terminal 17 in the left/right direction. The valve 25 is used for releasing gas generated inside the battery body 21 to the outside of the battery body 21.

When, for example, overcharging etc. of the single battery 11 is performed, there is a fear that gas may be generated mainly from an electrolyte solution. Since the battery body 21 is in a sealed state, internal pressure of the battery body 21 increases as the gas is generated. As soon as the internal pressure of the battery body 21 reaches operating pressure of the valve 25, the valve 25 can change from a closed state to an open state to thereby release the gas to the outside of the battery body 21.

A so-called break type valve or a so-called return type valve can be used as the valve 25. As the break type valve, the valve 25 changes from the closed state to the open state irreversibly. The break type valve can be formed, for example, by engraving the upper surface 23 of the battery body 21. On the other hand, as the return type valve, the valve 25 changes between the closed state and the open state reversibly in accordance with the internal pressure of the battery body 21. The return type valve can be configured, for example, using a spring.

Each of the busbars 13 has a rectangular shape on the whole. A pair of terminal insertion holes 14 are formed in the busbar 13 so that the positive electrode terminals 15 or the negative electrode terminals 17 can be inserted through the pair of terminal insertion holes 14 so as to be connected to the busbar 13 (see FIGS. 3A and 3B). The busbar 13 can be formed by punching a metal plate material made of copper, a copper alloy, aluminum, an aluminum alloy, gold, stainless steel (SUS), or the like. in a press step. So as to improve weldability, plating treatment with Sn, Ni, Ag, Au, or the like, may be applied to the busbar 13.

The busbars 13 are disposed so that the terminal insertion holes 14 through which the positive electrode terminals 15 or the negative electrode terminals 17 are inserted so as to be connected to the busbars 13 can be arranged in a row.

Incidentally, when nuts 43 are screwed and fastened to the positive electrode terminals 15 and the negative electrode terminals 17 which have been inserted through the terminal insertion holes 14, the busbars 13 according to the embodiment are electrically connected to the positive electrode terminals 15 and the negative electrode terminals 17. It is a matter of course that the busbars according to the invention may be electrically connected to the positive electrode terminals and the negative electrode terminals by laser welding without forming the terminal insertion holes 14.

In addition, each of the busbars 13 according to the first embodiment has notches 16 formed at its opposite edge portions between the pair of terminal insertion holes 14. When the busbar 13 is soldered to a land 30, excellent solder fillets can be formed between the notches 16 and the land 30. The land 30 is provided to extend on a flexible bridge portion 32 which will be described later.

As shown in FIG. 1, a U-shaped flexible printed circuit board 27 is disposed in the stuck direction of the single batteries 11 on the plurality of single batteries 11. The flexible printed circuit board 27 has belt-like wiring portions 26 and 28 and a connection wiring portion 24. The belt-like wiring portions 26 and 28 are disposed in two rows in the stuck direction of the single batteries 11. The connection wiring portion 24 connects one end sides of the belt-like wiring portions 26 and 28.

The belt-like wiring portions 26 and 28 are disposed in two rows on the positive electrode terminals 15 and the negative electrode terminals 17 respectively. The plurality of busbars 13 are arranged alternately in the stuck direction of the single batteries 11 on the positive electrode terminals 15 and the negative electrode terminals 17. The connection wiring portion 24 is disposed on ones of the valves 25 of the plurality of single batteries 11 on a front side.

As shown in FIG. 2, the battery monitoring unit 110 of the power storage device 100 according to the first embodiment is provided with a plurality of voltage detection lines 29, the flexible printed circuit board 27, an electronic circuit 48, the flexible bridge portions 32, and communication lines 31. The voltage detection lines 29 have one end portions connected to the busbars 13 respectively. The flexible printed circuit board 27 in which the plurality of voltage detection lines 29 are disposed extends in the stuck direction of the single batteries 11. The electronic circuit 48 is connected to the other end portions of the voltage detection lines 29 so as to detect voltage of each of the single batteries 11. The flexible bridge portions 32 serve as busbar fixing portions formed integrally with the flexible printed circuit board 27. The communication lines 31 are provided for making connection between the electronic circuit 48 and a battery ECU 20.

Figure 4:
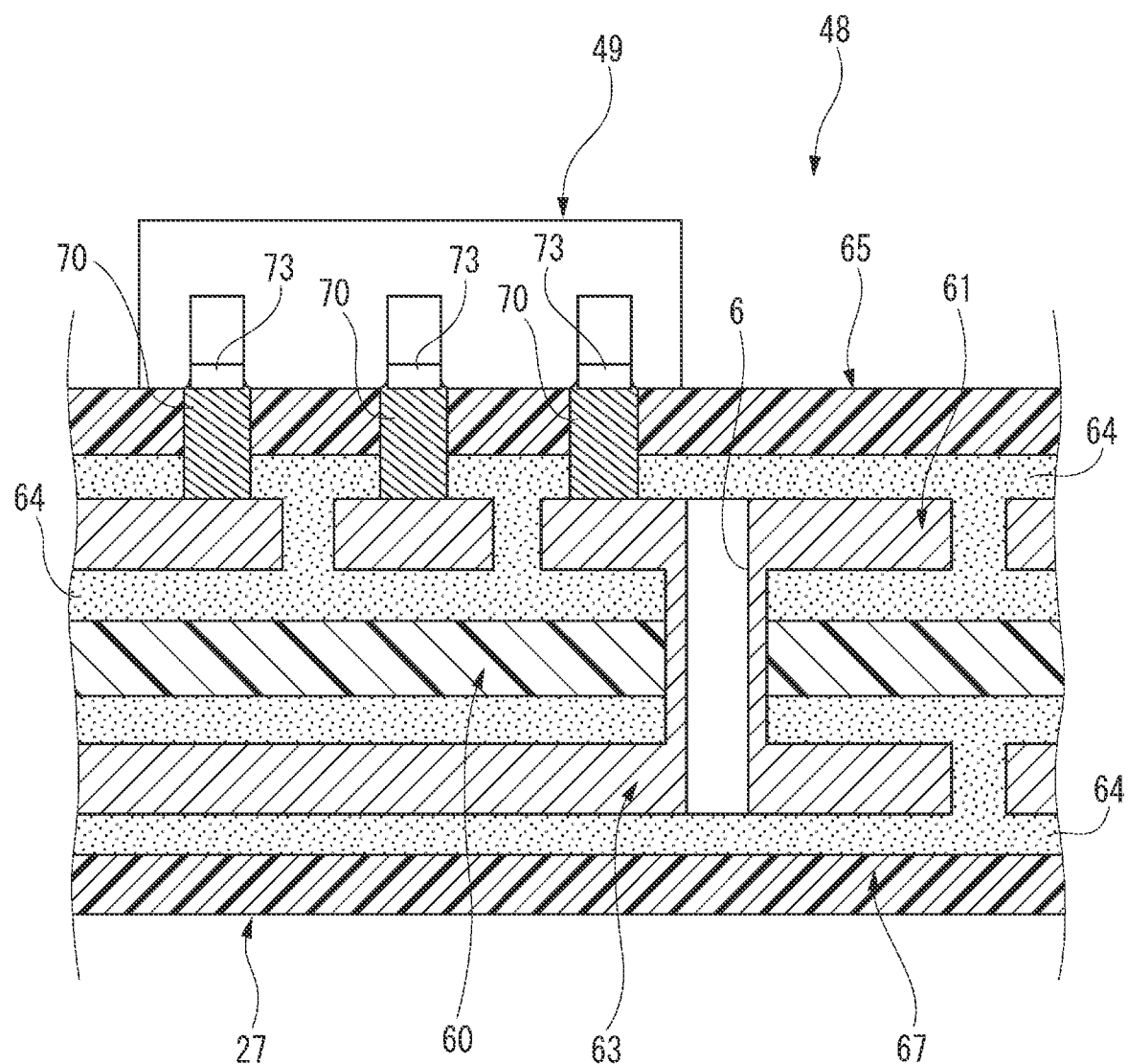
FIG. 4 is a schematic sectional view of an enlarged important part of a flexible printed circuit board on which constituent components of an electronic circuit are mounted.

The voltage detection lines 29 and the communication lines 31 disposed in the flexible printed circuit board 27 are formed in the following manner. That is, leadframes (metal thin plates) 61 and 63 including a large number of thin copper wirings which are, for example, pattern-formed by etching are disposed on a base film 60 and covered with transparent cover films 65 and 67 bonded by an adhesive agent 64 (see FIG. 4) so that the voltage detection lines 29 and the communication lines 31 can be formed. In addition, a flexible printed circuit board 27 according to a second embodiment has a two-layer structure in which voltage detection lines 29 are disposed on upper and lower surfaces of a base film 60 in each of belt-like wiring portions 26 and 28. When the voltage detection lines 29 are formed in the two-layer structure in this manner, the belt-like wiring portion 26, 28 in which the plurality of voltage detection lines 29 are arranged side by side at predetermined intervals (insulation distances) in a stuck direction of single batteries 11 can be made compact in terms of width. When the number of the stucked single batteries 11 is so small that a large number of the voltage detection lines 29 do not have to be provided, it is a matter of course that a flexible printed circuit board 27 having a single-layer structure of the voltage detection lines 29 may be used In the electronic circuit 48 according to the embodiment, components such as a chip fuse 39, a resistor 51, a capacitor 53 and cell monitoring ICs 49 are electrically connected by the leadframes 61 and 63 or through holes 6 and mounted on the connection wiring portion 24. For example, as shown in FIG. 4, each of the monitoring ICs 49 is surface-mounted on the flexible printed circuit board 27 in the following manner. That is, solders 70 are applied or printed on predetermined positions of the flexible printed circuit board 27 where the leadframes 61 and 63 have been pattern-formed into predetermined shapes simultaneously with the voltage detection lines 29 and the communication lines 31. Then, terminals 73 of the monitoring IC 49 are placed on the solders 70 to be reflow-soldered so that the monitoring IC 49 can be mounted on the flexible printed circuit board 27.

Incidentally, the electronic circuit 48 mounted on the connection wiring portion 24 of the flexible printed circuit board 27 may be formed into a multilayer structure including three or more layers. When the electronic circuit 48 is formed into the multilayer structure, the connection wiring portion 24 on which the electronic circuit 48 for detecting voltages of the single batteries 11 is mounted can be made compact.

That is, the plurality of voltage detection lines 29 and the communication lines 31 are electrically connected by the leadframes 61 and 63 and the through holes 6, and disposed in the flexible printed circuit board 27. The leadframes 61 and 63 are pattern-formed into the predetermined shapes. The one end portions of the voltage detection lines 29 are connected to the busbars 13 respectively while the other end portions of the voltage detection lines 29 are connected to predetermined connection end portions of the electronic circuit 48 respectively. The communication lines 31 make connection between the electronic circuit 48 mounted on the connection wiring portion 24 and terminals of a connector 22 provided and disposed on a front end of the belt-like wiring portion 26.

According to the first embodiment, as shown in FIG. 3B, each of the flexible bridge portions 32 is formed between adjacent ones of opening portions 33 which are opened in each belt-like wiring portion 26, 28 in one row at predetermined intervals in the stuck direction of the single batteries 11. Each opening portion 33 has an opening width H wider than a transverse-direction width w of each busbar 13. The opening portion 33 are approximately rectangular openings through which the positive electrode terminals 15 and the negative electrode terminals 17 are inserted. Each flexible bridge portion 32 which is shaped like a long and narrow belt is formed between adjacent ones of the opening portions 33. The land 30 provided to extend on the flexible bridge portion 32 from the one end portion of the corresponding voltage detection line 29 is formed on the upper surface of the flexible bridge portion 32.

As shown in FIGS. 3A and 3B, each voltage detection line 29 disposed on a lower surface side of the flexible printed circuit board 27 has one end portion exposed on the upper surface side of the flexible printed circuit board 27 immediately before the flexible bridge portion 32 so as to be connected to the land 30. Incidentally, the voltage detection line 29 exposed on the upper surface side of the flexible printed circuit board 27 in the drawings is in fact coated and covered with the not-shown cover film 65 to be insulated.

Therefore, each of the busbars 13 is soldered (e.g. reflow-soldered) to a corresponding one of the lands 30 of the flexible bridge portions 32. Thus, the busbar 13 is fixed to a corresponding one of the belt-like wiring portions 26 and 28 of the flexible printed circuit board 27. On this occasion, excellent solder fillets are formed between the notches 16 of the busbar 13 and the land 30. Accordingly, the busbar 13 is electrically, mechanically and firmly connected to the land 30 of the flexible bridge portion 32.

The transverse-direction width w of the busbar 13 fixed to the flexible bridge portion 32 is narrower than the opening width H of the opening portion 33. Accordingly, even when the flexible bridge portion 32 is slanted or bent, the busbar 13 can be displaced desirably without interfering with the belt-like wiring portion 26, 28.

In addition, the plurality of opening portions 33 are opened at the predetermined intervals in one row in the stuck direction of the single batteries 11 in the belt-like wiring portion 26, 28 so as to form the flexible bridge portions 32. Outer side ends of the flexible bridge portions 32 formed thus are coupled by a coupling portion 34 which is continuous in the stuck direction of the single batteries 11. The outer side ends of the flexible bridge portions 32 are respectively connected to the coupling portion 34 so as to suppress a variation in individual position among the busbars 13 fixed to the flexible bridge portions 32.

Accordingly, the busbars 13 are not retained by busbar retention members as in the background art but only directly fixed to the flexible bridge portions 32 formed in the belt-like wiring portions 26 and 28 of the flexible printed circuit board 27 which is bent easily. In spite of this, workability for inserting the terminal insertion holes 14 of the busbars 13 onto the positive electrode terminals 15 and the negative electrode terminals 17 correspondingly can be prevented from being lowered, and bonding force between the busbars 13 and the flexible bridge portions 32 can be prevented from being lowered.

According to the first embodiment, the communication lines 31 are disposed in the flexible printed circuit board 27 to connect the electronic circuit 48 and the terminals of the connector 22 to each other respectively. The electronic circuit 48 is mounted on the connection wiring portion 24. The terminals of the connector 22 are provided and disposed on the front end of the belt-like wiring portion 26. Therefore, when the connector 22 and the battery ECU 20 are connected to each other by a not-shown wire harness, the communication lines 31 can electrically connect the electronic circuit 48 and the battery ECU 20 to each other. The communication lines 31 may connect connection portions of the electronic circuit 48 respectively to the battery ECU 20 so as to make communication therebetween or may connect the connection portions of electronic circuit 48 collectively to the battery ECU 20 so as to make multiplex communication therebetween.

In the power storage device 100 according to the first embodiment, a gas discharging duct 45 extending in the front/rear direction of the battery assembly 47 is disposed on the upper surfaces 23 of the plurality of single batteries 11. A lower surface of the gas discharging duct 45 makes contact with the upper surfaces 23 of the single batteries 11. The gas discharging duct 45 moves gas released from the valves 25 of the single batteries 11 in a direction away from the battery assembly 47. When, for example, the power storage device 100 is mounted in the vehicle, the gas discharging duct 45 can be used to discharge the gas released from the valves 25 to the outside of the vehicle.

When the flexible printed circuit board 27 is disposed on the plurality of single batteries 11, the lower surface side of the connection wiring portion 24 on which the electronic circuit 48 is mounted is disposed to make contact with an upper surface 46 of the gas discharging duct 45.

In the flexible printed circuit board 27 disposed on the plurality of single batteries 11, the positive electrode terminals 15 and the negative electrode terminals 17 are inserted through the terminal insertion holes 14 of the busbars 13 fixed to the flexible bridge portions 32 respectively. The nuts 43 are screwed and fastened to the positive electrode terminals 15 and the negative electrode terminals 17 which have been inserted through the terminal insertion holes 14. Thus, the busbars 13 electrically connect the plurality of single batteries 11 in series.

The connection wiring portion 24 of the flexible printed circuit board 27 on which the electronic circuit 48 is mounted is covered with a protective cover 10 so that undesired contact of an external member can be prevented.

Next, effects of the aforementioned configuration will be described.

According to the battery monitoring unit 110 according to the first embodiment, the plurality of voltage detection lines 29, the plurality of flexible bridge portions 32 and the communication lines 31 are formed integrally as the flexible printed circuit board 27. The voltage detection lines 29 are respectively connected to the busbars 13 which electrically connect the single batteries 11 to one another. The busbars 13 are fixed to the flexible bridge portions 32. The communication lines 31 are provided for making connection between the electronic circuit 48 and the battery ECU 20. The electronic circuit 48 for detecting voltage of each of the single batteries 11 is directly mounted on the flexible printed circuit board 27. Thus, the battery monitoring unit 110 is configured.

Therefore, in the battery monitoring unit 110 according to the embodiment, the constituent components of the electronic circuit 48 such as the chip fuse 39 and the cell monitoring ICs 49 are surface-mounted on the flexible printed circuit board 27 so as to be formed integrally therewith. In the flexible printed circuit board 27, the voltage detection lines 29 and the communication lines 31 are, for example, formed as a circuit on the base film 60 by printing. Thus, assembling work for the battery monitoring unit 110 configured thus according to the embodiment can be easier than that for the background-art battery monitoring unit in the battery pack.

Further, in the battery monitoring unit 110 according to the first embodiment, the flexible bridge portions 32 each shaped like a long and narrow belt have flexibility. The flexible bridge portions 32 serve as busbar fixing portions for fixing the busbars 13. Therefore, when the battery monitoring unit 110 is attached to the power storage device 100, the flexible bridge portions 32 are slanted or bent so that the busbars 13 can be displaced following the positive electrode terminals 15 and the negative electrode terminals 17 of the single batteries 11. In addition, individual differences of the cells and pitch tolerances or height differences of the positive electrode terminals 15 and the negative electrode terminals 17 caused by expansion etc. among the respective single batteries 11 can be also absorbed.

In addition, in the battery monitoring unit 110 according to the first embodiment, the busbars 13 are soldered and fixed to the lands 30 which are provided to extend on the flexible bridge portions 32 from the other end portions of the voltage detection lines 29. Therefore, when the constituent components of the electronic circuit 48 are surface-mounted on the flexible printed circuit board 27, the busbars 13 can be soldered (e.g. reflow-soldered) to the lands 30 of the flexible bridge portions 32 simultaneously. Therefore, electric connection of the busbars 13 to the voltage detection lines 29 and fixation of the busbars 13 to the flexible bridge portions 32 are performed simultaneously. Accordingly, the assembling work for the battery monitoring unit 110 can be made further easier.

In addition, in the battery monitoring unit 110 according to the first embodiment, the gas discharging duct 45 is disposed on the upper surfaces 23 of the plurality of single batteries 11, and a portion (i.e. the connection wiring portion 24) of the flexible printed circuit board 27 on which the electronic circuit 48 is mounted is disposed to make contact with the upper surface 46 of the gas discharging duct 45. Therefore, the gas generated inside the single batteries 11 can be discharged to the outside by the gas discharging duct 45. In addition, the portion of the flexible printed circuit board 27 on which the electronic circuit 48 is mounted is disposed to make contact with the upper surface of the gas discharging duct 45. Thus, the electronic circuit 48 which is mounted on the flexible printed circuit board 47 can be supported surely.

Next, a battery monitoring unit according to a second embodiment of the invention will be described.

Figure 5:
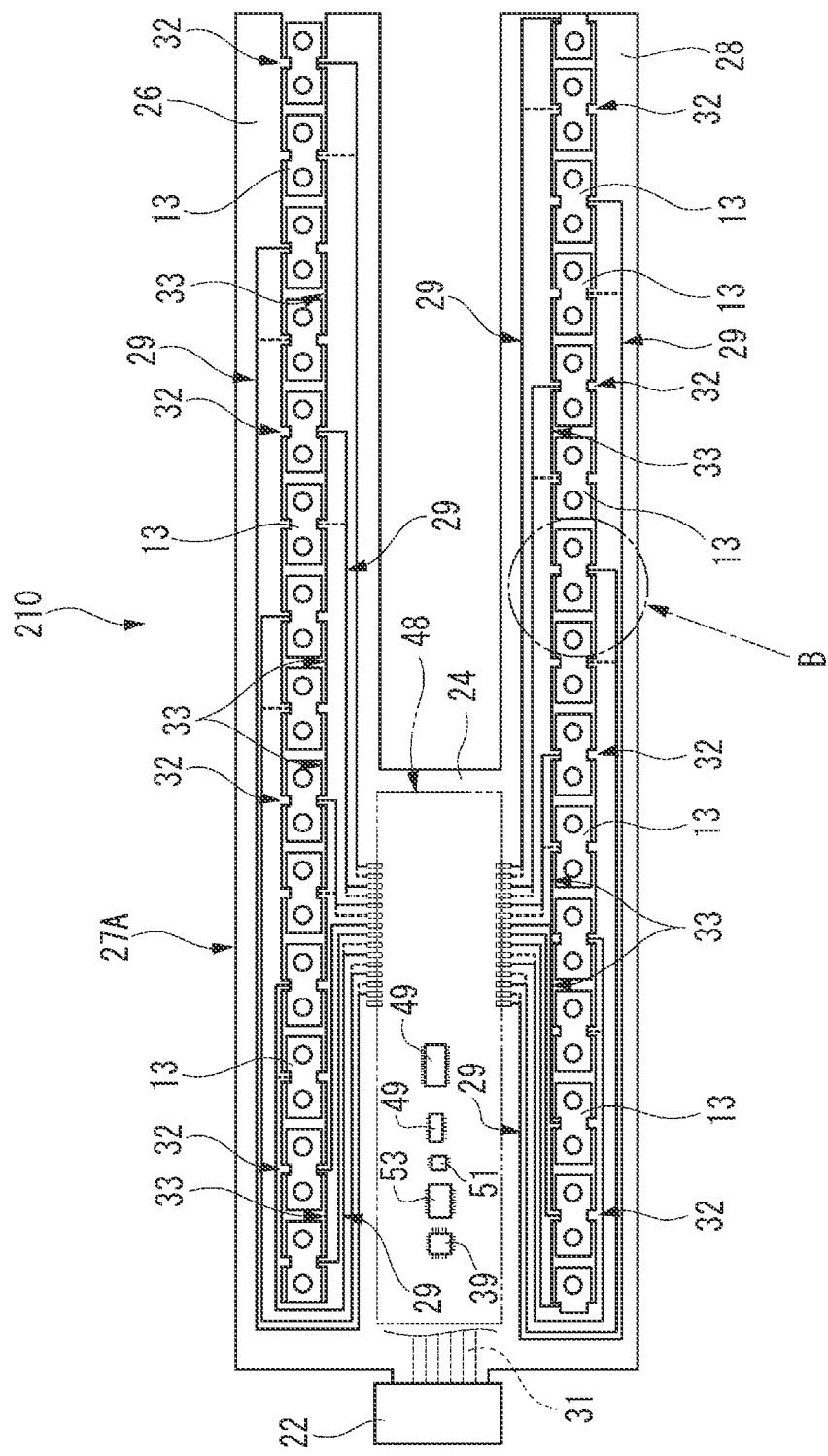
FIG. 5 is a plan view of a battery monitoring unit according to a second embodiment.
Figure 6A:
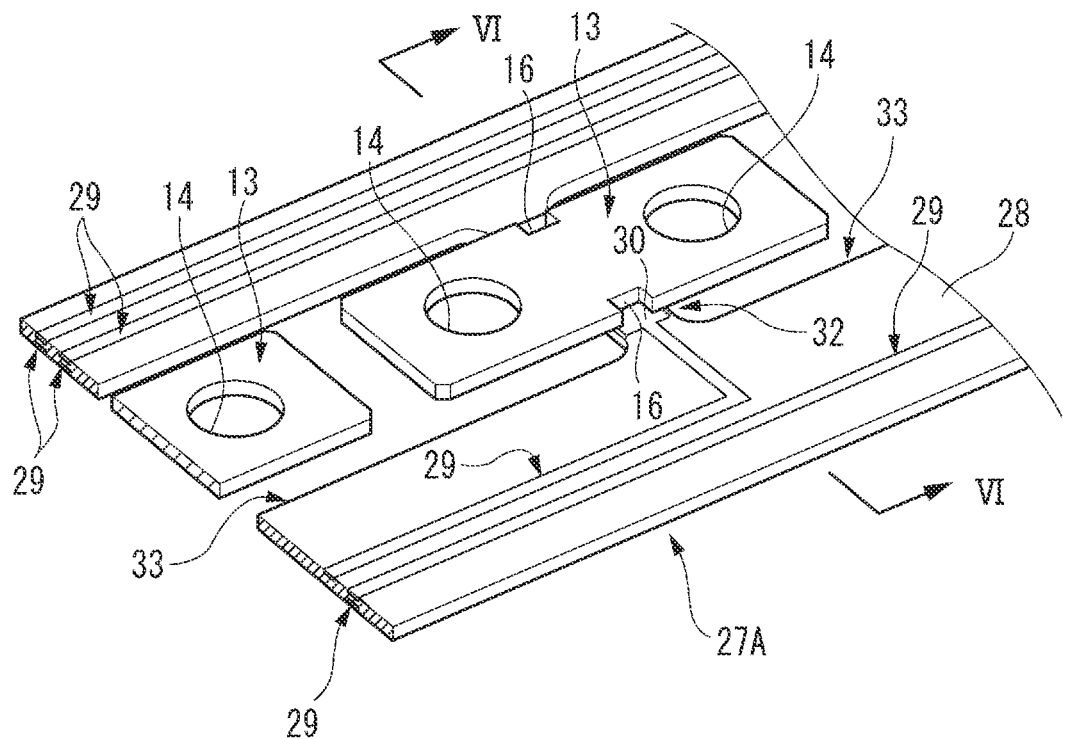
FIG. 6A is a perspective view of an enlarged portion B of the battery monitoring unit in FIG. 5.
Figure 6B:
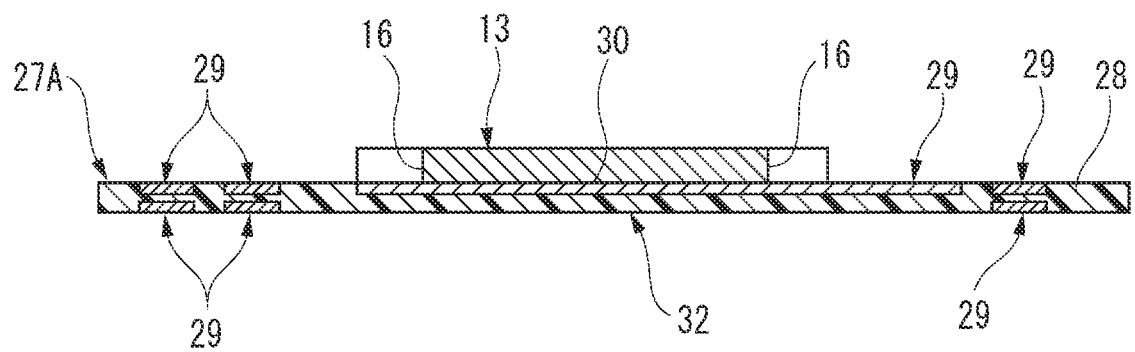
FIG. 6B is a sectional view taken along a line of arrows VI-VI of FIG. 6A.

FIG. 5 is a plan view of the battery monitoring unit 210 according to the second embodiment of the invention. FIG. 6A is a perspective view of an enlarged portion B of the battery monitoring unit 210 in FIG. 5. FIG. 6B is a sectional view taken along a line of arrows VI-VI of FIG. 6A. In the second embodiment, constituents the same as the aforementioned constituents which have been described in the first embodiment will be referred to by the same signs correspondingly and respectively, and duplicated description thereof will be omitted.

Similarly to the configuration of the aforementioned battery monitoring unit 110 according to the first embodiment, the battery monitoring unit 210 according to the second embodiment is provided with a plurality of voltage detection lines 29, a flexible printed circuit board 27A, an electronic circuit 48, flexible bridge portions 32, and communication lines 31. One end portions of the voltage detection lines 29 are connected to a plurality of busbars 13 respectively. The flexible printed circuit board 27A on which the plurality of voltage detection lines 29 are disposed extends in a stuck direction of single batteries 11. The electronic circuit 48 is connected to the other end portions of the voltage detection lines 29 so as to detect voltage of each of the single batteries 11. The flexible bridge portions 32 are formed integrally with the flexible printed circuit board 27A. The communication lines 31 are provided for making connection between the electronic circuit 48 and a battery ECU 20.

In the aforementioned flexible printed circuit board 27 according to the first embodiment, all the voltage detection lines 29 are provided side by side on inner sides of the busbars 13 which are arrayed in parallel on the belt-like wiring portions 26 and 28, as shown in FIG. 2. On the other hand, in the flexible printed circuit board 27A according to the second embodiment, the voltage detection lines 29 are divided to be provided side by side on inner sides and outer sides of the busbars 13 which are arrayed in parallel on the belt-like wiring portions 26 and 28, as shown in FIG. 5 and FIGS. 6A and 6B.

That is, the flexible printed circuit board 27 and the flexible printed circuit board 27A are suitably selected and used in accordance with a plurality of power storage devices 100 in which a protrusion interval varies between positive electrode terminals 15 and negative electrode terminals 17 which are protruded from upper surfaces 23 of battery bodies 21 so that a disposition space can vary between the inner sides and the outer sides of the busbars 13. Thus, the battery monitoring unit 110, 210 can be adapted to the power storage devices 100 in various forms.

Figure 7A:
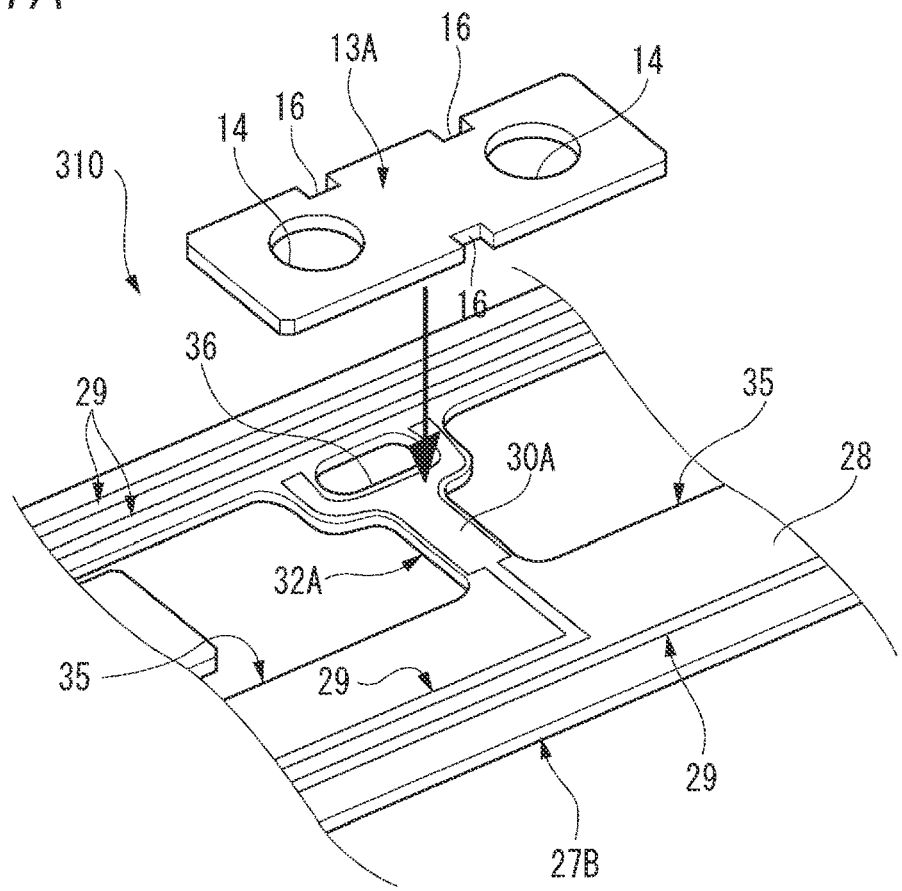
FIG. 7A is an exploded perspective view of an enlarged important part of a battery monitoring unit according to a third embodiment.
Figure 7B:
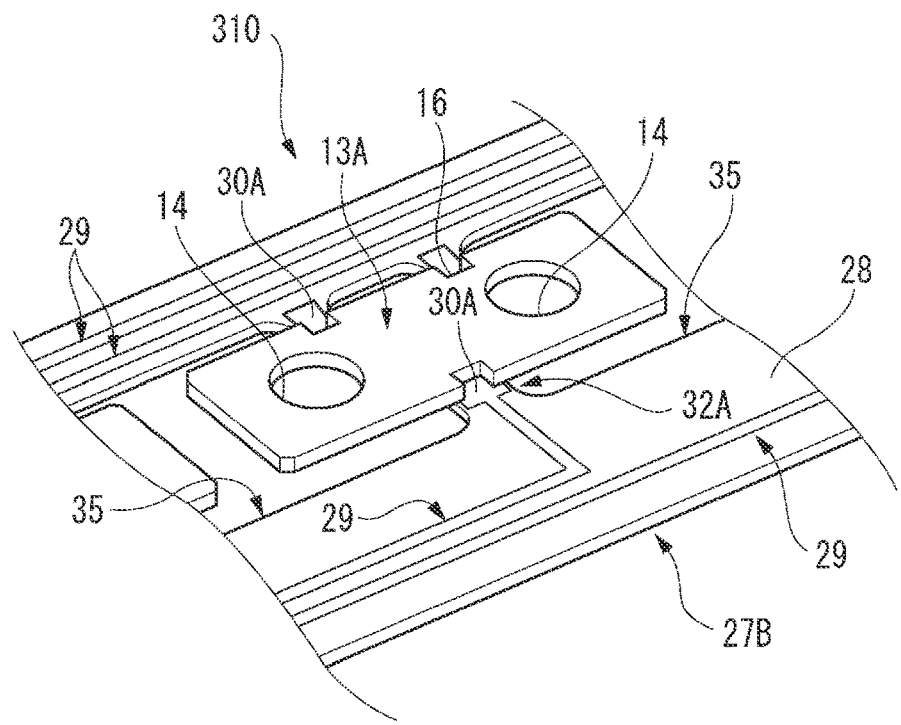
FIG. 7B is a perspective view of the enlarged important part of the battery monitoring unit according to the third embodiment.
Figure 8A:
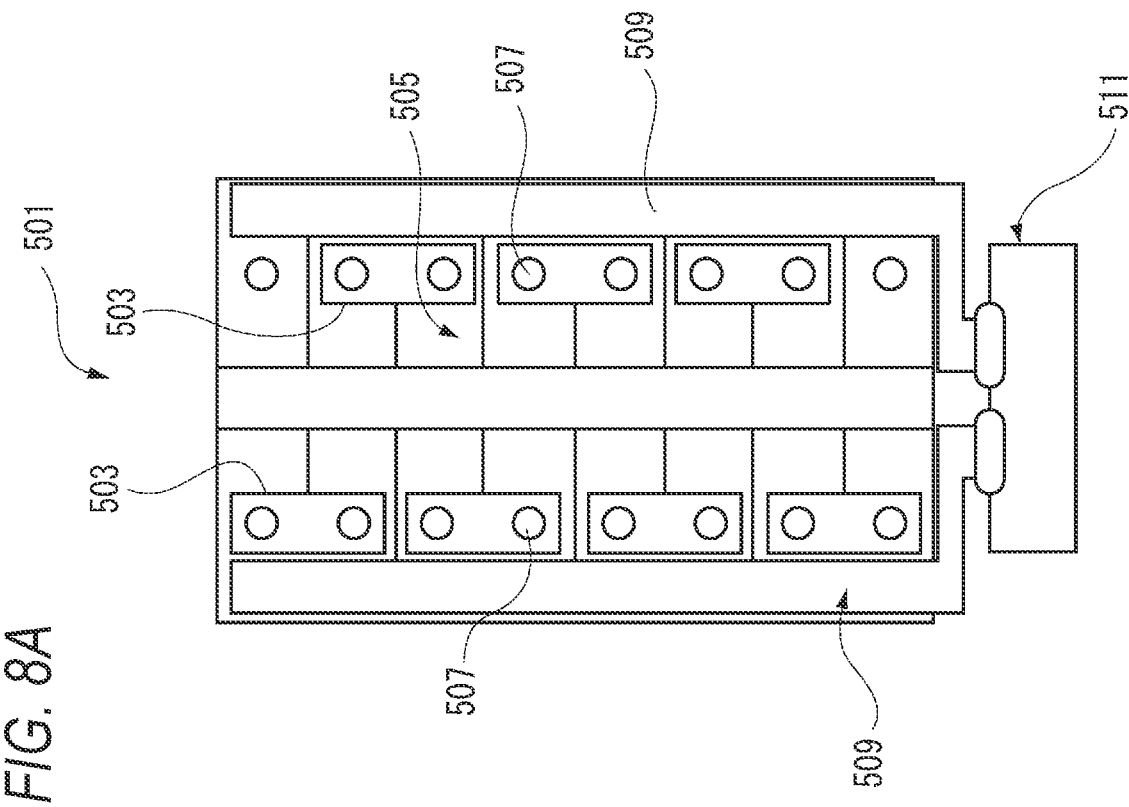
FIGS. 8A and 8B are explanatory views of a background-art power storage device in which voltage detection lines led out of a plurality of battery cells are connected to a battery ECU having a battery cell voltage detection circuit.
Figure 8B:
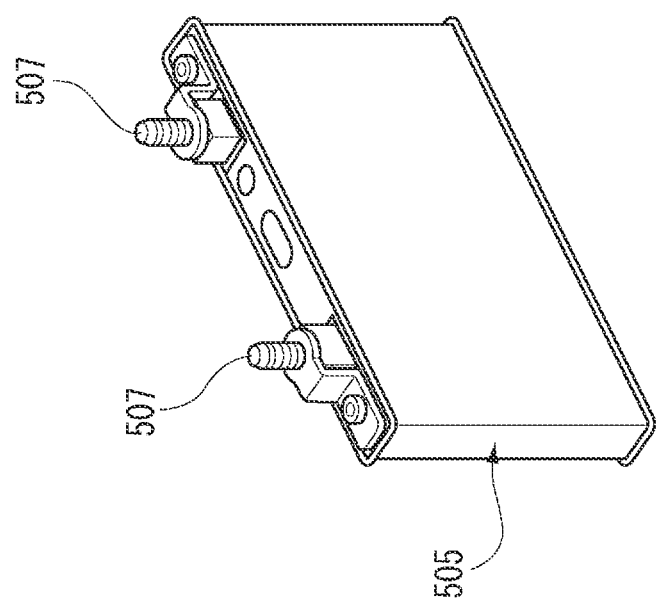

FIGS. 7A and 7B are an exploded perspective view and a perspective view of an enlarged important part of a battery monitoring unit 310 according to a third embodiment of the invention.

A flexible printed circuit board 27B of the battery monitoring unit 310 according to the third embodiment has the same configuration as the aforementioned flexible printed circuit board 27A according to the second embodiment except that the configuration of each of the flexible bridge portions 32 is changed to the configuration of each of flexible bridge portions 32A.

As shown in FIG. 7A, each of the flexible bridge portions 32A of the flexible printed circuit board 27B according to the third embodiment is formed between adjacent ones of opening portions 35 which are opened respectively in one row in a stuck direction of single batteries 11 in each of belt-like wiring portions 26 and 28. Each of the opening portions 35 is a convex opening on the whole. The flexible bridge portion 32A which is shaped like a belt widened on one end side is formed between the adjacent opening portions 35. A substantially Y-shaped land 30A provided to extend on the flexible bridge portion 32A from one end portion of a corresponding voltage detection line 29 is formed on an upper surface of the flexible bridge portion 32A. Incidentally, a lightening hole 36 is formed in the widened portion of the flexible bridge portion 32A so that the widened portion of the flexible bridge portion 32A can be lowered in rigidity and bent easily.

On the other hand, a pair of notches 16 are formed at outer edge portions of each of busbars 13A according to the third embodiment. Thus, the busbar 13A has a total of three notches 16.

The busbars 13A are soldered (e.g. reflow-soldered) to the lands 30A of the flexible bridge portions 32A respectively. Thus, the busbars 13A are fixed to the respective belt-like wiring portions 26 and 28 of the flexible printed circuit board 27B. On this occasion, excellent solder fillets are formed between the three notches 16 of each of the busbars 13A and the corresponding land 30A.

Accordingly, the busbar 13A according to the third embodiment can have three solder fillets on the land 30A of the flexible bridge portion 32A. Thus, the busbar 13A can be connected to the land 30A of the flexible bridge portion 32A more electrically and mechanically firmly than the busbar 13 according to the aforementioned embodiment.

Although the various embodiments have been described above with reference to the drawings, it is a matter of course that the invention is not limited to such examples. It is obvious that those skilled in the art can arrive at various change examples or modification examples without departing from the scope described in Claims. Accordingly, it should be understood that the various change examples or modification examples surely belong to the technical scope of the invention.

For example, the aforementioned configuration examples have been descried in the case where each electrode is an electrode column by way of example. However, the electrode may be a flat plate electrode. Accordingly, connection between the busbar and the electrode is not limited to screw fastening but may be welding or the like. In addition, it is a matter of course that the connection patterns of the plurality of voltage detection lines 29 to the busbars 13 are not limited to the connection patterns in each of the aforementioned embodiments but various connection patterns which can be routed in the flexible printed circuit board 27 can be used.

Accordingly, according to the battery monitoring unit 110, 210, 310 according to each of the aforementioned embodiments, complex assembling work can be reduced using a simple structure, and the pitch tolerances of the positive electrode terminals 15 and the negative electrode terminals 17 among the respective single batteries 11 can be also absorbed.

Here, the aforementioned features of the embodiments of the battery monitoring unit according to the invention will be summarized and listed briefly as follows.

[1] A battery monitoring unit (110, 210, 310) comprising:
a plurality of voltage detection lines (29);
a flexible printed circuit board (27, 27A, 27B) extending in a stuck direction of single batteries;
an electronic circuit (48) connected to one end portions of the voltage detection lines so as to detect voltage of each of the single batteries and mounted on the flexible printed circuit board;
a plurality of busbar fixing portions (flexible bridge portions 32, 32A) formed integrally with the flexible printed circuit board and to which the plurality of the busbars are fixed respectively; and
communication lines (31) disposed in the flexible printed circuit board so as to connect between the electronic circuit and a battery ECU (20),
wherein the other end portions of the plurality of voltage detection lines (29) are respectively connected to the plurality of the busbars (13, 13A) disposed in the stuck direction so as to electrically connect the plurality of the single batteries of a battery assembly (47),
wherein the plurality of the voltage detection lines are disposed in the flexible printed circuit board (27, 27A, 27B).

[2] The battery monitoring unit (110, 210, 310) according to the aforementioned configuration [1],
wherein the plurality of the busbar fixing portions include flexible bridge portions (32, 32A) between adjacent ones of a plurality of opening portions (33, 35) opening at predetermined interval in a row in the stuck direction, and
wherein each of the plurality of the opening portions (33, 35) has an opening width (H) wider than a transverse-direction width (w) of each of the plurality of the busbars (13, 13A), in a direction which is perpendicular to the stuck direction and a thickness direction of the plurality of the busbars.

[3] The battery monitoring unit (110, 210, 310) according to the aforementioned configuration [2],
wherein the plurality of the busbars (13, 13A) are soldered and fixed to lands (30, 30A) positioned and extending on the flexible bridge portions (32, 32A) from the other end portions of the plurality of the voltage detection lines (29) respectively.

[4] The battery monitoring unit (110, 210, 310) according to any one of the aforementioned configurations [1] through [3],
wherein a gas discharging duct (45) extending in the stuck direction so as to discharge gas generated inside the single batteries (11) to the outside is disposed on upper surfaces (23) of the single batteries, and
wherein a portion of the flexible printed circuit board (27), on which the electronic circuit (48) is mounted, is disposed to be contact with an upper surface of the gas discharging duct.

REFERENCE SIGNS LIST

11 . . . single battery, 13 . . . busbar, 15 . . . positive electrode battery (electrode), 17 . . . negative electrode terminal (electrode), 20 . . . battery ECU, 27 . . . flexible printed circuit board, 29 . . . voltage detection line, 31 . . . communication line, 32 . . . flexible bridge portion (busbar fixing portion), 47 . . . battery assembly, 48 . . . electronic circuit, 100 . . . power storage device, 110 . . . battery monitoring unit

What is claimed is:

1. A battery monitoring unit comprising:
a plurality of voltage detection lines;
a plurality of busbars coupled by the plurality of the voltage detection lines;
a unitary flexible printed circuit board extending in a stuck direction of single batteries;
an electronic circuit connected to one end portions of the plurality of the voltage detection lines so as to detect voltage of each of the single batteries and mounted on the flexible printed circuit board;
a plurality of busbar fixing portions formed integrally with the flexible printed circuit board and to which the plurality of the busbars are fixed respectively; and
communication lines disposed in the flexible printed circuit board so as to connect between the electronic circuit and a battery ECU,
wherein the other end portions of the plurality of the voltage detection lines are respectively connected to the plurality of the busbars disposed in the stuck direction so as to electrically connect the plurality of the single batteries of a battery assembly,
wherein the plurality of the voltage detection lines are disposed in the flexible printed circuit board,
wherein the busbar fixing portions are configured to be slanted or bent to facilitate displacement of the busbars relative to the flexible printed circuit board following terminals of the single batteries,
wherein the plurality of the busbar fixing portions include flexible bridge portions between adjacent ones of a plurality of opening portions opening at predetermined interval in a row in the stuck direction,
wherein each of the plurality of the opening portions has an opening width wider than a transverse-direction width of each of the plurality of the busbars, in a direction which is perpendicular to the stuck direction and a thickness direction of each of the plurality of the busbars, and wherein the plurality of the busbars are soldered and fixed to lands positioned and extending on the flexible bridge portions from the other end portions of the plurality of the voltage detection lines respectively.

2. The battery monitoring unit according to claim 1, wherein a gas discharging duct extending in the stuck direction so as to discharge gas generated inside the single batteries to the outside is disposed on upper surfaces of the single batteries, and wherein a portion of the flexible printed circuit board, on which the electronic circuit is mounted, is disposed to be contact with an upper surface of the gas discharging duct.

3. The battery monitoring unit according to claim 1, wherein the flexible bridge portions have flexibility such that when the battery monitoring unit is attached to the single batteries, the flexible bridge portions bend to displace the busbars following electrodes of the single batteries thereby absorbing individual differences of the single batteries and pitch tolerances or height differences of the electrodes.

4. The battery monitoring unit according to claim 1, wherein the busbars are soldered to lands on the flexible bridge portions simultaneously when the electronic circuit is mounted on the flexible printed circuit board.

5. The battery monitoring unit according to claim 4, wherein electric connection of the busbars to the voltage detection lines and fixation of the busbars to the flexible bridge portions occurs simultaneously.

6. A battery monitoring unit comprising:
a plurality of voltage detection lines;
a plurality of busbars coupled by the plurality of the voltage detection lines;
a flexible printed circuit board extending in a stuck direction of single batteries;
an electronic circuit connected to one end portions of the plurality of the voltage detection lines so as to detect voltage of each of the single batteries and mounted on the flexible printed circuit board;
a plurality of busbar fixing portions formed integrally with the flexible printed circuit board and to which the plurality of the busbars are fixed respectively; and
communication lines disposed in the flexible printed circuit board so as to connect between the electronic circuit and a battery ECU,
wherein the other end portions of the plurality of the voltage detection lines are respectively connected to the plurality of the busbars disposed in the stuck direction so as to electrically connect the plurality of the single batteries of a battery assembly,
wherein the plurality of the voltage detection lines are disposed in the flexible printed circuit board,
wherein the plurality of the busbar fixing portions include flexible bridge portions between adjacent ones of a plurality of opening portions opening at predetermined interval in a row in the stuck direction, and
wherein the plurality of the busbars are soldered and fixed to lands positioned and extending on the flexible bridge portions from the other end portions of the plurality of the voltage detection lines respectively.

* * * * *